United States Patent
Kasemo et al.

(10) Patent No.: US 10,930,983 B2
(45) Date of Patent: Feb. 23, 2021

(54) BATTERY WITH SENSOR

(71) Applicants: INSPLORION SENSOR SYSTEMS AB, Gothenburg (SE); Bengt Herbert Kasemo, Köpmannebro (SE); Christoph Langhammer, Gothenburg (SE)

(72) Inventors: Bengt Herbert Kasemo, Köpmannebro (SE); Christoph Langhammer, Gothenburg (SE)

(73) Assignee: INSPLORION SENSOR SYSTEMS AB, Gothenburg (SE)

( * ) Notice: Subject to any disclaimer, the term of this patent is extended or adjusted under 35 U.S.C. 154(b) by 1171 days.

(21) Appl. No.: 15/302,118

(22) PCT Filed: Mar. 19, 2015

(86) PCT No.: PCT/EP2015/055745
§ 371 (c)(1),
(2) Date: Oct. 5, 2016

(87) PCT Pub. No.: WO2015/154961
PCT Pub. Date: Oct. 15, 2015

(65) Prior Publication Data
US 2017/0117594 A1     Apr. 27, 2017

(30) Foreign Application Priority Data
Apr. 8, 2014 (SE) .................. 1450436-9

(51) Int. Cl.
*H01M 10/48* (2006.01)
*H01M 10/42* (2006.01)
(Continued)

(52) U.S. Cl.
CPC .......... *H01M 10/48* (2013.01); *G01N 21/554* (2013.01); *G01R 31/3644* (2013.01);
(Continued)

(58) Field of Classification Search
CPC .... H01M 10/06; H01M 10/425; H01M 10/48; H01M 10/486; H01M 2220/20
See application file for complete search history.

(56) References Cited

U.S. PATENT DOCUMENTS

2005/0117158 A1   6/2005 Kanai et al.
2006/0012776 A1   1/2006 Newell et al.
(Continued)

FOREIGN PATENT DOCUMENTS

| CN | 102608041 A | 7/2012 |
| CN | 102608041 B | 3/2014 |

(Continued)

OTHER PUBLICATIONS

"Advanced Battery Sensors for Improved Performance", Palo Alto Research Center Incorporated, PARC, California, USA.
(Continued)

*Primary Examiner* — Carlos Barcena
(74) *Attorney, Agent, or Firm* — Moser Taboada

(57) ABSTRACT

The present invention relates to a battery (100) comprising an electrode material (102a), an electrolyte material (104), a battery charge sensor (106, 206, 306) comprising a plasmonic sensing element (108, 208, 308) having a sensing volume (110, 210, 310) within the battery (100, 200, 401) and which upon illumination with electromagnetic radiation exhibits a localized surface plasmon resonance condition being dependent on a charge state of the battery (100, 200, 401). A system and a method for determining a charge state of a battery are further provided.

13 Claims, 4 Drawing Sheets

(51) Int. Cl.
*H01M 10/06* (2006.01)
*G01N 21/552* (2014.01)
*G01R 31/36* (2020.01)

(52) U.S. Cl.
CPC ......... *H01M 10/06* (2013.01); *H01M 10/425* (2013.01); *H01M 10/486* (2013.01); *H01M 2220/20* (2013.01); *Y02E 60/10* (2013.01)

(56) References Cited

U.S. PATENT DOCUMENTS

| 2014/0092375 A1 | 4/2014 | Raghavan et al. |
| 2014/0203783 A1 | 7/2014 | Kiesel et al. |

FOREIGN PATENT DOCUMENTS

| CN | 102621078 B | 3/2014 |
| JP | 2002350314 A | 12/2002 |
| JP | 2005156415 A | 6/2005 |
| JP | 2007071615 A | 3/2007 |
| JP | 2012132875 A | 7/2012 |
| JP | 2013221883 A | 10/2013 |
| JP | 2013234941 A | 11/2013 |

OTHER PUBLICATIONS

Langhammer, "Nanoplasmonic Sensing for Nanomaterials Science and Catalysis", SPIE Newsroom, May 23, 2012.
International Search Report and Written Opinion dated Apr. 28, 2015 for PCT Application No. PCT/EP2015/055745.

BATTERY WITH SENSOR

FIELD OF THE INVENTION

The present invention relates to a battery comprising a battery charge sensor. A system and a method for determining a charge state of a battery are further provided.

BACKGROUND OF THE INVENTION

Batteries used to provide electricity have a broad range of applications ranging from consumer products, to vehicles like electrical cars, to large-scale storage of electricity e.g. in connection with solar electricity. With the development of clean energy sources and cleaner use of energy the need and use of batteries are constantly increasing both for stationary and mobile applications, and the battery area is characterized by intense R&D.

Batteries are broadly speaking of two kinds, rechargeable batteries and non-rechargeable ones. Especially, but not exclusively, for the former kind of battery, the charge state is a particularly important property, during use, storage and charging. The details of the charging process of a battery are important, since they can affect the operation of the battery and its lifetime. The need to control and know the charge state of a battery during use of the battery, which in turn determines how much remaining power that can be extracted from the battery, is obviously very large. Examples are information about remaining driving distance of electrical vehicles and remaining operation time of batteries providing back up power during power failures, e.g. in intensive care units.

Electrical cars, for example, are equipped with batteries for a certain driving range, when the batteries are fully charged. During driving the driver needs to know how long the remaining driving distance is and if the car can reach the final destination or the next charging station. During charging of the battery one may want to know when the battery is charged enough for a certain driving distance. The charging process can be varied and optimized for different purposes like shortest possible charge up time or alternatively a gentler charging that optimizes the lifetime of the battery, for example.

For the above reasons it is highly desirable to be able to determine the charge state and/or control the charging process and/or to determine the quality of a battery.

The charge state of a battery is commonly estimated from direct measurement variables. In so-called offline techniques, such as Coulomb-counting, the battery is charged and discharged at constant rate, which offers an estimation of the charge state of the battery but this technique is protracted, costly, and interrupt the battery performance. Therefore, efforts are made to find so-called online techniques for measuring the state of charge for a battery. In general there are several methods for determining the charge state of a battery, which may for example use chemical, voltage, current or pressure based measuring techniques.

Another concern with batteries is safety aspects. If the power out-take during use, or the charging current during charge-up, are too high it may lead to a too high temperature in a battery, which in turn can be destructive for the battery or in other cases, with certain battery types, even lead to fire or explosion. This creates a need for temperature control of batteries.

US 2014/0203783 A1 discloses a system utilizing optical sensors arranged within or on portions of an electrochemical energy device to measure operating parameters such as mechanical strain and/or temperature during charge/recharge cycling.

US 2014/0092375 A1 discloses a monitoring and management system, MMS, including one or more fibre optic cables arranged within or on portions of an energy storage device. Each fibre optic cable includes multiple optical sensors. At least one of the optical sensors is configured to sense a parameter of the energy storage device that is different from a parameter of the energy storage device sensed by at least another optical sensor of the multiple optical sensors. The MMS includes a light source configured to provide light to the one or more fibre optic cables and a detector configured to detect light reflected by the optical sensors. The detector generates an electrical signal based on the reflected light. A processor is coupled to receive the electrical signal, to analyze the electrical signal, and to determine state of the energy storage device based on analysis of the electrical signal.

There is, however, a need for more efficient and reliable methods for determining the charge state and/or the temperature and/or the ageing of a battery.

SUMMARY OF THE INVENTION

An object of the present invention is to provide a battery with a battery charge sensor, which allows the charge state of the battery to be determined.

According to a first aspect of the invention, a battery is provided. The battery comprising an electrode material, an electrolyte material, a battery charge sensor comprising a plasmonic sensing element having a sensing volume within the battery and which upon illumination with electromagnetic radiation exhibits a localized surface plasmon resonance condition being dependent on a charge state of the battery.

By proving a battery with a battery charge sensor, a reliable and stable arrangement for determining the charge state of the battery is provided. The battery charge sensor is moreover compact and has a low cost and low complexity.

The wording plasmonic sensing element should be construed as a sensing element in which plasmons may be excited. Plasmons should here be understood as quanta of plasma oscillations associated with a local collective oscillation of charge density. The charges may for instance be provided by electrons.

The wording localized surface plasmon resonance, LSPR, is to be understood as an excited state of the charge carriers within the plasmonic sensing element, which can be excited by photons or, equivalently, by the electromagnetic field of light incident on the plasmonic sensing element. The LSPR condition is a resonance condition associated to the collective oscillation of charge density and to the boundary conditions resulting from the finite size of the plasmonic sensing element. As a result, a charge density wave is formed with a frequency/wavelength/energy that is set by the electronic properties of the material of the plasmonic sensing element, its geometry, size and the material properties of the environment surrounding the the plasmonic sensing element. As an example, the LSPR typically occurs in the visible part of the electromagnetic wavelength spectrum if the plasmonic sensing element is a gold nanoparticle having a diameter in the range of 50-100 nm.

It should further be understood that the LSPR occurs when the electromagnetic radiation interacts with the plasmonic sensing element. As a result an enhanced local electromagnetic field is created in the close vicinity of the plasmonic sensing element. The strength of the enhancement and the spatial extent of the enhanced field depend on a number of parameters such as the material, size, shape, and environment of the plasmonic sensing element. The enhanced electric field is beneficial as it improves the sensitivity of the plasmonic sensing element such that a more efficient sensing of the charge state of the battery is provided.

The wording sensing volume is to be understood as a volume defined by the spatial extension of the electromagnetic field from the excited localized surface plasmon resonance. It is to be understood that electromagnetic radiation, which is pertaining to the sensing volume provides information about the charge state of the battery. Since the spatial extension of this electromagnetic field depends both on the details of the plasmonic sensing element, on the properties of the materials surrounding the plasmonic sensing element and on the direction of the incident electromagnetic field in relation to the geometry of the plasmonic sensing element, the volume of the sensing volume depends on all these parameters. To this end, the electromagnetic field related to the excited LSPR falls of gradually, often approximately exponentially, away from the plasmonic sensing element such that the sensing volume typically has an extension on the length scale of 10-100 nm. Hence the plasmonic sensing elements provide a local probe volume within the battery.

The wording charge state should be construed as the capacity of the battery. The charge state also referred to as state of charge, SOC, is defined as the percentage of the full capacity of a battery that is available for further discharge. The charge state is commonly used for regulating the charging and discharging of the battery.

In other words, the charge state of a battery relates to the amount of charge that can be extracted from the battery in terms of an integrated current that is the integral of current over time until there is no remaining useful charge in the battery. A fully charged battery has a maximum capacity and maximum charge state that is represented by the integral over time of the current that can be extracted from the battery until there is no charge left. In the latter case the battery is fully discharged. A convenient labelling is to say that the fully charged battery has a charge state of fully or substantially 100% charged. Likewise a convenient labelling is to say that the fully discharged battery has a charge state of fully discharged or substantially 0% charged. When half of the maximum amount of useful charge remains in the battery its charge state is substantially 50% charged.

The plasmonic sensing element may be arranged at a predetermined depth within the electrode material and wherein the sensing volume of the plasmonic sensing element covers a portion of the electrode material.

This is advantageous as this arrangement provides efficient sensing of the charge state of the battery. This is achieved, as when the battery is charged or discharged the composition of the electrode material changes, e.g. by insertion or removal of ions and/or by reaction processes converting the electrodes' material from one state or composition to another. Such compositional changes are associated with changes in the charge state of the battery, and are accompanied by changes in the dielectric constant of the compositionally changed electrode material. By arranging the plasmonic sensing element at a predetermined depth within the electrode material such that the sensing volume fully or partially overlaps with the compositionally changed electrode material the charge state of the battery may be determined. In other words, the charge state of the battery changes the composition of the electrode material, which relates to a change in the dielectric constant of the electrode material. A change in the dielectric constant of the electrode material further changes the localized plasmon resonance condition for the plasmonic sensing element. Hence the charge state of the battery may be determined by analysing e.g. the spectral peak position and/or the amplitude of the extinction peak related to the localized plasmon resonance condition.

The plasmonic sensing element may be arranged within the electrolyte material and wherein the sensing volume of the plasmonic sensing element covers a portion of the electrolyte material.

This is advantageous as when a battery is charged or discharged the composition of the battery electrolyte material changes, typically by increase or decrease of ion concentrations in the electrolyte material. Such electrolyte composition changes, which are related to changes in the charge state of the battery, are also accompanied by changes in the dielectric constant of the electrolyte. By arranging the plasmonic sensing element within the electrolyte material such that the sensing volume of the plasmonic sensing element covers a portion of the electrolyte material the battery charge sensor will sense the compositionally changed electrolyte, i.e. the compositional change will cause a change in the localized plasmon resonance condition, e.g. the spectral peak position or the amplitude of the extinction peak. By detecting the local surface plasmon resonance condition or a change to this condition the charge state of the battery may be determined.

It should be noted that the above embodiments allow for separate analysis of the charge state of the battery by sensing in the electrolyte material or in the electrode material The battery charge sensor may further comprise a separating layer, which is arranged at an outer surface of the plasmonic sensing element.

The separating layer should be understood to be a layer that protects the plasmonic sensing element of the battery charge sensor from being in direct contact with the material surrounding the plasmonic sensing element. The separating layer may therefore prevent the plasmonic sensing element from reacting with materials in the environment of the battery charge sensor. The separating layer may further prevent the plasmonic sensing element from reacting with liquids, gases and/or solid materials present in the battery or getting into the battery from its surroundings. Structural reshaping and/or other reactions such as oxidation or corrosion of the plasmonic sensing element may thereby be further mitigated. This is advantageous as it is known that changes to the shape and/or size and/or chemical composition of the plasmonic sensing element may change the local surface plasmon condition of the plasmonic sensing element.

The arrangement according to the present invention may be described as indirect sensing utilizing the plasmonic sensing element. In other words, the battery charge sensor is indirect as the plasmonic sensing element is separated from surrounding environment of the battery.

It should be noted that the separating layer is made thin enough such that the sensing volume of the LSPR penetrates though the separating layer and senses a volume outside the separating layer.

The separating layer of the battery charge sensor may be arranged such that the sensing volume of the plasmonic sensing element covers a portion of the electrode material and/or the electrolyte material.

This is advantageous as by choosing the material and/or the dimensions of the separating layer the extent to which the sensing volume enters into the electrode material and/or the electrolyte material may be tuned.

The battery may further comprise an additional plasmonic sensing element which is arranged within a shielding layer, and wherein the sensing volume of the additional plasmonic sensing element is within the shielding layer of the additional plasmonic sensing element.

The additional plasmonic sensing element is thereby arranged within a controlled and/or protective environment.

The shielding layer should, in contrast to the separating layer, be construed as a layer thick enough and/or having material properties such that the sensing volume of the additional plasmonic sensing element is within the shielding layer of the additional plasmonic sensing element i.e. the sensing volume does not substantially extend outside the shielding layer. The localized plasmon resonance condition is then only affected by changes in the plasmonic sensing element itself and/or in the shielding layer, specifically their temperature, but not by changes in the charge state of the battery. This is advantageous since with the shielding layer temperature alone can be measured. Hence, reference or calibration of for example the temperature of the battery may be provided such that a more accurate battery charge sensor may be provided.

The plasmonic sensing element may be a disk, rod, wire, ellipse, polygon, triangle, sphere, cube, star, hole in thin metal film, nanoshell, core-shell particle, nanorice or nanoring.

The plasmonic sensing element may comprise a semiconductor and/or a metal.

It is understood that the semiconductor should comprise a plurality of free charge carriers, i.e. electrons and/or holes such that the semiconductor plasmonic sensing element may provide a LSPR condition. This may for instance be achieved by doping the semiconductor.

The semiconductor material may for instance comprise silicon, germanium, carbon and/or III-V semiconductor materials. These are all known materials in material science and semiconductor technology, which facilitates the fabrication of the plasmonic sensing element as for instance standard epitaxial growth and processing techniques may be used.

The metal may be selected from a group consisting of Ag, Au, Cu, Al, Mg, Ni, Pd and Pt, or alloys comprising at least one metal selected from the group.

These materials are known to provide LSPRs in the ultra violet-visible-near infrared, UV-vis-NIR, wavelength ranges of the electromagnetic spectrum. Hence standard optical techniques may be used to excite and detect LSPRs of the plasmonic sensing element.

The optical properties of the battery charge sensor may be changed by varying, in accordance with the disclosed materials, shapes and/or dimensions of the plasmonic sensing element given above. Hence the LSPR condition may be tuned such that the specific optical wavelength for which the LSPR occurs is provided in a desired wavelength range.

The separating layer may comprise a material selected from a group of materials comprising a metal oxide, a metal carbide or a metal nitride; a semiconductor oxide or a semiconductor nitride or a semiconductor carbide; an insulator, and a polymer. This is an advantage as a separating layer may be provided which may protect the plasmonic sensing element. The versatility of the battery charge sensor is therefore increased.

The battery charge sensor may further comprise a plurality of plasmonic sensing elements, which may increase the reliability and precision of the charge battery sensor. The plurality of plasmonic sensing elements may be implemented as many similar plasmonic sensing elements are placed at different locations in a battery, in order to provide information about the charge state and temperature at these different locations and thereby give a more complete picture of the battery charge state or temperature. The plurality of plasmonic sensing elements may also be implemented as many different plasmonic sensing elements with different sensing properties, which provide advantages with respect to more detailed information and improved opportunities to compensate for or eliminate perturbing signals.

The separating layer may have has a thickness in the range of 0.5 to 150 nm. This is advantageous as a separating layer is thereby provided which protects the plasmonic sensing element while allowing the sensing volume of the plasmonic sensing element to cover a volume outside the separating layer. The plasmonic sensing element may thereby sense a charge state of the battery at a location outside the separating layer.

According to a second aspect of the invention, a system for determining a charge state of a battery is provided. The system comprising a battery according to any one of the embodiments above, a source of electromagnetic radiation arranged to illuminate the plasmonic sensing element of the battery charge sensor such that the plasmonic sensing element exhibits a localized surface plasmon resonance condition; and a detector arranged to detect electromagnetic radiation pertaining to the localized surface plasmon resonance condition of the plasmonic sensing element, a processing unit arranged to analyse the detected electromagnetic radiation to determine the charge state of the battery.

The system for determining a charge state of a battery may thereby take advantage of the reliability and robustness of the battery charge sensor when sensing the charge state of the battery. An efficient system for monitoring LSPR and changes to the LSPR is furthermore provided by detecting electromagnetic radiation pertaining to the localized surface plasmon resonance condition of the plasmonic sensing element. The battery charge sensor may further offer remote real time sensing of the charge state of the battery, using for instance conventional optical characterization techniques such as transmission and/or reflection measurements.

According to a third aspect of the invention, a method for determining a charge state of a battery is provided. The method comprising providing a battery according to any one of the embodiments above, illuminating by means of a source of electromagnetic radiation the plasmonic sensing element of the battery charge sensor such that the plasmonic sensing element exhibits a localized surface plasmon resonance condition, detecting by means of a detector the electromagnetic radiation pertaining to the localized surface plasmon resonance condition of the plasmonic sensing element, analysing by means of a processing unit the detected electromagnetic radiation to determine the charge state of the battery.

In general, features of the second and the third aspects of the invention provide similar advantages as discussed above in relation to the first aspect of the invention.

Further features of, and advantages with, the present invention will become apparent when studying the appended claims and the following description. The skilled person will realize that different features of the present invention may be combined to create embodiments other than those described in the following, without departing from the scope of the present invention.

BRIEF DESCRIPTION OF THE DRAWINGS

This and other aspects of the present invention will now be described in more detail, with reference to the appended drawings showing embodiments of the invention. The figures should not be considered limiting to the invention to the specific embodiment; instead they are used for explaining and understanding the invention.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The basic idea of this invention is to provide a battery with a battery charge sensor such that the charge state of the battery may be determined. By providing a battery with a battery charge sensor a reliable and stable arrangement for determining the charge state of the battery is provided. The battery charge sensor is moreover compact and has a low cost and low complexity.

Figure 1:
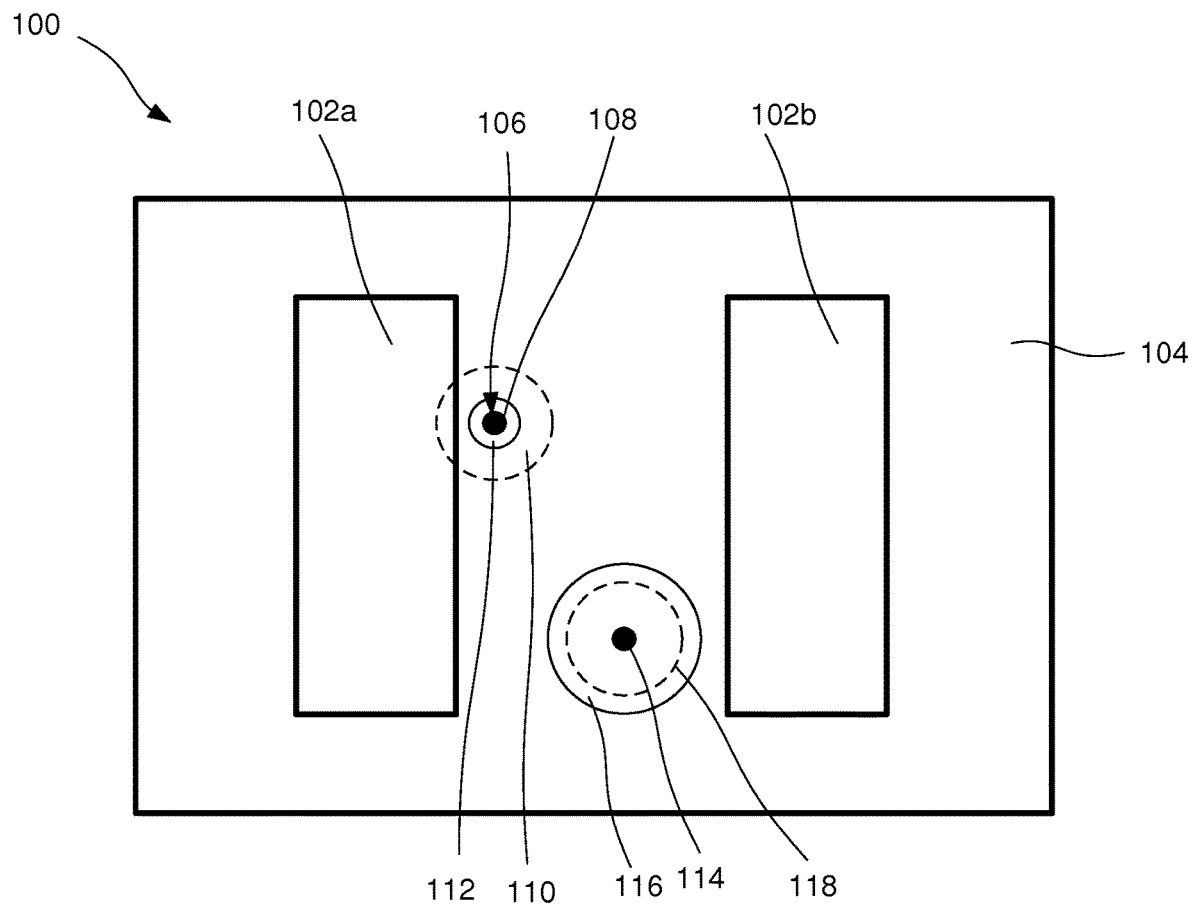
FIG. 1 is a schematic top view of battery according to one embodiment of the present invention.

Next, a battery 100 according to an embodiment of the present invention will be described with reference to FIG. 1. FIG. 1 shows a top view of the battery 100. The battery 100 comprises two electrodes with the electrode materials 102a and 102b, an electrolyte material 104 and a battery charge sensor 106. The battery charge sensor 106 comprises a plasmonic sensing element 108 having a sensing volume 110 within the battery 100 and which upon illumination with electromagnetic radiation exhibits a localized surface plasmon resonance condition being dependent on a charge state of the battery 100.

As an example, the battery may be a lead (lead-acid) battery. For such a battery, when it is less charged or fully discharged, the electrode materials 102a and 102b comprise a larger portion of lead sulphate, $PbSO_4$ than when the battery is more charged or fully charged. Correspondingly, for a more charged or fully charged battery the anode electrode material 102a comprises lead oxide, $PbO_2$, and the cathode electrode material 102b comprises lead, Pb to a larger extent than for a less charged or fully discharged battery.

For a less charged of fully discharged battery the electrolyte material 104 is essentially transformed into water while for the more charged or fully charged battery the electrolyte material is essentially turned into sulphuric acid, $H_2SO_4$. Since both of the electrode materials 102a and 102b and also the electrolyte material 104 change in composition and in their respective dielectric constants, depending on the charge state of the battery the present invention allows for determining the charge state of the battery by probing the electrode and electrolyte materials utilizing the plasmonic sensing element.

It should be noted that it is advantageous to probe the electrode material and the electrolyte material, since the different materials may carry local information, which may be complementary, about the charge state of the battery.

The present invention is not limited to the battery type disclosed above and the battery may for example be a lithium ion battery or a metal hydride battery. For the lithium ion battery, charging and discharging are represented by insertion or withdrawal of lithium ions into/out of the anode electrode material and the cathode electrode material, with accompanying changes of the electrolyte material.

In the above given example the plasmonic sensing element a gold disk. The disk may have a disk diameter in the range 5-500 nm. The height of the plasmonic sensing element may also vary in the range of 5-100 nm.

According to other embodiments the plasmonic sensing element 108 may have a different shape and size.

Moreover, a separating layer 112 made of compact silicon dioxide $SiO_2$ is further provided, see FIG. 1. These materials given above are chosen in order to provide an efficient battery charge sensor 106 comprising a plasmonic sensing element 108, which has a LSPR condition such that their resonances occur in the visible or near visible regions of the electromagnetic spectrum. Other embodiments of the present invention will be exemplified in the following.

The plasmonic sensing element may be fabricated by many different established methods in nanotechnology. Examples of methods for fabrication of the plasmonic sensing elements are electron beam lithography, stamping, imprinting, colloidal lithography and a special version called hole mask lithography. The choice of method depends on e.g., the size, shape, material, of the plasmonic sensing element and if the plasmonic sensing element is for example deposited on a substrate. The choice of method also depends on cost aspects.

It should be noted that sensing volume 110 is a volume defined by the spatial extension of the electromagnetic field from the excited localized surface plasmon resonance, LSPR. It is to be understood that electromagnetic radiation, which is pertaining to the sensing volume 110 provides information about the charge state of the battery 100. Since the spatial extension of this electromagnetic field depends both on the details of the plasmonic sensing element 106, on the properties of the materials surrounding the plasmonic sensing element and on the direction of the incident electromagnetic field in relation to the geometry of the plasmonic sensing element 106, the volume of the sensing volume 110 depends on all these parameters. To this end, the electromagnetic field related to the excited LSPR falls of gradually, often approximately exponentially, away from the plasmonic sensing element 106 such that the sensing volume typically has an extension on the length scale of 10-100 nm. Hence the plasmonic sensing element 106 provides a local probe volume within the battery 100.

The separating layer 112 is a layer that simultaneously separates the sensing elements from external chemicals or materials and prevents the plasmonic sensing elements from reacting with or being modified by such materials and gases. The separating layer is thin enough that the electromagentic field from the LSPR excitation extends outside the separating layer and senses dielectric changes outside the separating layer 112. In other words the sensing volume 110 extends outside the separating layer 112.

The separating layer 112 may be any dielectric material that fulfils the requirements given above e.g. a metal oxide, nitride or carbide or a polymer or other material. The separating layer 112 may be deposited by various film deposition methods such as physical vapour deposition methods, PVD, chemical vapour deposition, CVD, methods, electrochemical methods, e.g. electro-deposition or anodic oxidation methods, or spin coating methods. There are a number of other or specialized methods for film deposition or layer deposition that can also be used such as atomic layer deposition, ALD, and atomic layer epitaxy, ALE.

According to other embodiments the plasmonic sensing elements may be arranged at different locations with respect to the electrodes and the electrolyte in order to obtain complementary information about the charge state of the battery. For example, the plasmonic sensing element may be placed on the surface of the electrode material and be provided with a first separating layer separating the plasmonic sensing element from the electrode material. Moreover a second separating layer, which is thicker than the first separating layer, may be arranged on a surface of the plasmonic sensing element which is oppositely arranged to the surface of the electrode material. By this arrangement the sensing volume of the plasmonic sensing element may be arranged such that it overlaps with the electrode material, but not overlaps with the electrolyte material. This results in that the plasmonic sensing element may sense and detect the material composition or changes in the material composition, e.g. of the dielectric constant, of the electrode material, but not the composition or changes in the composition of the electrolyte material.

According to another embodiment the plasmonic sensing element may be arranged such that the thicker second separating layer is arranged between the sensing element and the electrode material and the thinner separating layer between the plasmonic sensing element and the electrolyte material. This arrangement allows for sensing of the material composition and/or changes in the material composition of the electrolyte material.

According to yet another embodiment a plurality of plasmonic sensing elements are provided and arranged such that the material composition and/or changes in the material composition of the electrolyte material and the electrode material are sensed. Hence information about the charge state of the battery may be provided at different location in the battery.

Again referring to FIG. 1, the battery 100 further comprises an additional plasmonic sensing element 114 arranged within a shielding layer 116. The shielding layer 116 is arranged such that the sensing volume 118 of the additional plasmonic sensing element 114 is within the shielding layer 116 of the additional plasmonic sensing element 114.

The role of the shielding layer is to confine the sensing volume to lie within a volume inside the shielding layer. Hence the electromagnetic field from the LSPR does not reach outside the shielding layer and therefore the material composition, or changes to the material composition of dielectric materials outside the shielding layer, are not sensed. This allows, for example, temperature alone to be measured without interference from other changes, as the LSPR condition of the plasmonic sensing element may be changed by a change in temperature. The shielding layer may be of any material that fulfils the same function as the separating layer in that it prevents any interactions or reactions between the surroundings and the additional plasmonic sensing element but in addition is thick enough that changes outside the shielding layer are not sensed. Hence, changes relating to temperature of the sensing layer itself and temperature of the shielding layer are then sensed via the influence of temperature on the LSPR condition. The temperature sensitivity can be enhanced if the dielectric constant of the shielding layer is chosen so that its dielectric constant is highly dependent on the temperature.

The battery charge sensor may thereby take advantage of the reliability and robustness of the battery sensor when sensing battery charge state changes, via electrode material changes and/or via electrolyte changes, and in addition also when sensing battery temperature. An efficient system for monitoring LSPR and changes to the LSPR is furthermore provided by detecting electromagnetic radiation that is being scattered and/or reflected by and/or transmitted through the battery charge sensor. The battery charge sensor may further offer remote real time battery sensing, using for instance conventional optical characterization techniques such as transmission and/or reflection measurements. The battery charge sensor may thereby take advantage of the reliability and robustness of the plasmonic sensing element(s) when the battery charge state changes, via electrode material changes and/or via electrolyte changes, and in addition to sensing the battery temperature.

According to another embodiment, the battery charge sensor may further comprise a plurality of plasmonic sensing elements, which may increase the reliability and precision of the battery charge sensor. A battery charge sensor comprising a plurality of plasmonic sensing elements may be referred to as multiplexing battery charge sensor.

To this end, multiplexing is here to be understood as a multiplicity of plasmonic sensing elements, where each plasmonic sensing element may be somewhat different in its response to the charge state it is intended to measure. Multiplexing can, for example, be implemented by placing many different plasmonic sensing elements in a battery charge sensor, where each plasmonic sensing element has a different response to changes in the charge state of the battery via for example changes in the material composition of the materials within the battery such as the electrode material and the electrolyte material According to another embodiment the battery charge sensor may comprise an additional sensing element, having a shielding layer and a plasmonic sensing element having a separating layer between an electrode material and the respective sensing elements. In such an arrangement the additional plasmonic sensing element may measure only temperature while the plasmonic sensing element may measure the combined effect of temperature and battery charge state. By using the information from the additional sensing element, measuring only temperature, it may be possible to compensate the signal from the plasmonic sensing element for temperature effects such that the charge state of the battery may be obtained with better accuracy. This principle may further be extended to comprise a plurality of the different sensing elements, each of which measures one or several properties and where the combined information from at least a portion of the a plurality of sensor elements may be used to extract specific, desired information about the charge state of the battery by this multiplexing approach.

One reason for multiplexing is to measure many different quantities that together give more precise information about the battery charge state. For example, if the battery charge sensor has many different plasmonic sensing elements, whose sensing volumes extends to different parts of the battery, like one plasmonic sensing element senses only electrolyte material, one senses only electrode material and one additional plasmonic sensing element senses none of these materials, but senses only temperature by use of a shielding layer, this is an example of triplexing.

Figure 2:
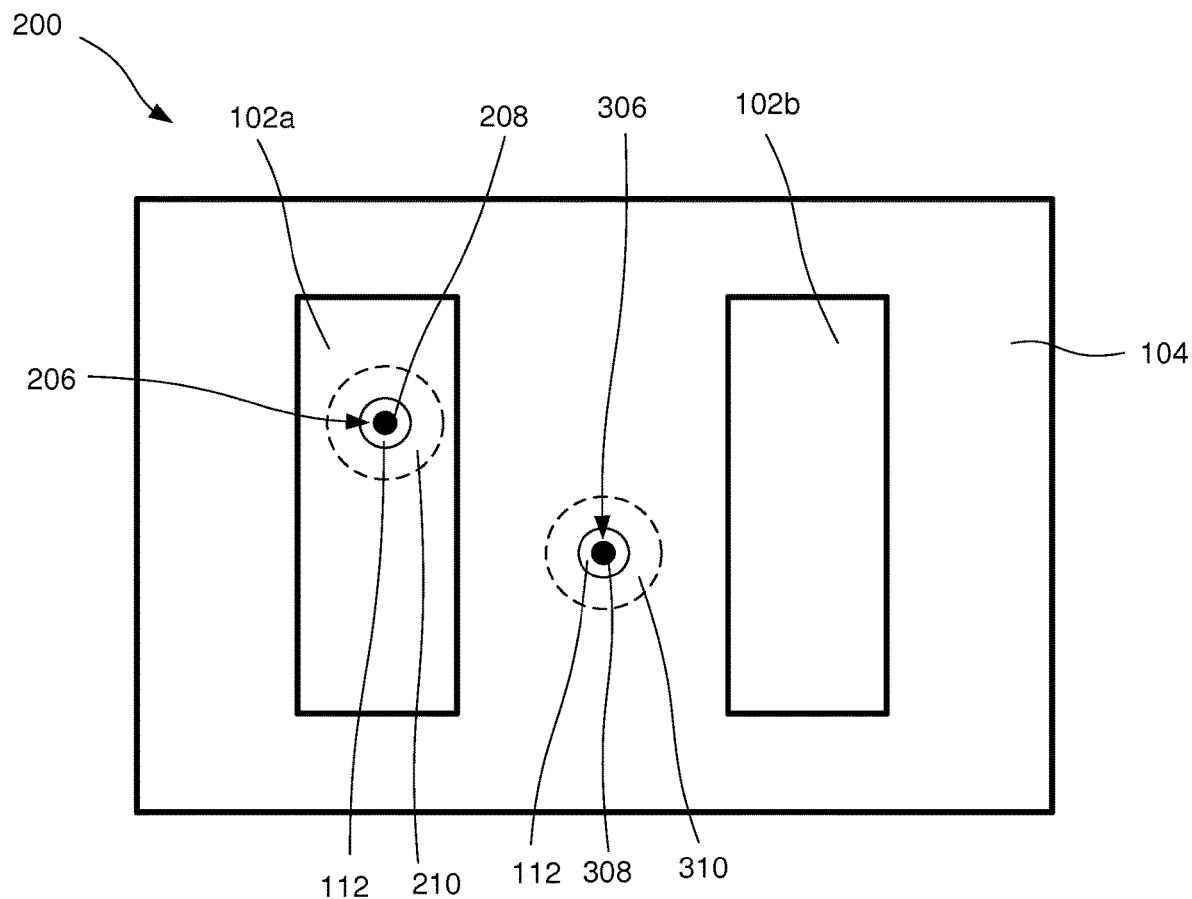
FIG. 2 is a schematic top view of battery according to another embodiment of the present invention.

FIG. 2 illustrates a battery 200 according to another embodiment of the present invention. The battery 200 comprises two electrode materials 102a and 102b, an electrolyte material 104 and two battery charge sensors 206 and 306.

The battery charge sensor 206 comprises a plasmonic sensing element 208 which is arranged at a predetermined depth within the electrode material 102a and wherein the sensing volume 210 of the plasmonic sensing element 208 covers a portion of the electrode material 102a. The battery charge sensor 206 further comprises a separating layer 112.

The skilled person in the art should realize that the electrode material 102a and 102b may be the same material or differ depending on the type of battery.

The battery electrode is a fundamental building stone of a battery. As the charge state of a battery changes, also the composition and the dielectric constant of a battery electrode changes. Therefore LSPR measurements that exclusively measures changes of battery electrodes are valuable and in many situations sufficient to obtain the desired charge state information.

When a battery is not fully charged and not fully discharged a battery electrode is not homogenous in its composition. It may therefore be advantageous, and it provides more precise information about the battery charge state, if the local composition of a battery electrode is measured at many different locations, e.g. at different predetermined depths into the battery electrode. This can be implemented in many different ways. One way is to insert plasmonic sensing elements at several predetermined depths into the battery electrode. Another one is to coat plasmonic sensing elements with a wedge-shaped coating of the electrode material, such that each location of the sensing elements has a different electrode thickness of the electrode material between the plasmonic sensing element and the electrolyte material. The optical illumination and detection system is then arranged such that local/spatial information is obtained for different wedge thicknesses.

The battery 200 further comprises a plasmonic sensing element 308 which is arranged within the electrolyte material 104 and wherein the sensing volume 310 of the plasmonic sensing element 308 covers a portion of the electrolyte material 104. This is advantageous as the charge state of the battery depends on the electrolyte composition. For example, in a lead acid battery the composition changes from essentially sulphuric acid to essentially water as the battery goes from fully charged to fully discharged. This compositional change of the electrolyte is accompanied by dielectric changes that can be measured by LSPR if the plasmonic sensing element is placed such that its sensing volume overlaps with the electrolyte. Measurements on the electrolyte alone may therefore provide enough information about the charge state of the battery.

It should be noted that the battery charge sensor may according to other embodiments not comprise a separating layer. This simplifies the fabrication of the battery charge sensor.

According to another embodiment the battery charge sensor comprises an arrangement of plasmonic sensing elements such that they measure the charge state at many different locations on one or several electrodes. This represents an advantage, since the charge state may vary at different locations on a battery electrode and between different electrodes.

The plasmonic sensing elements may according to other embodiments be shaped as a rod, wire, ellipse, polygon, triangle, sphere, cube, star, hole in thin metal film, nanoshell, core-shell particle, nanorice or nanoring.

It should be noted that the additional plasmonic sensing element may comprise the same material and have the same shapes as disclosed above in relation to the plasmonic sensing element.

The plasmonic sensing element may comprise a semiconductor and/or a metal. It is understood that the semiconductor comprises a plurality of free charge carriers i.e. electrons and/or holes such that the semiconductor based plasmonic sensing elements may provide a LSPR condition. This may for instance be achieved by doping of the semiconductor. The semiconductor material may for instance comprise silicon, carbon and/or III-V semiconductor materials. These are all known material in material sciences and semiconductor technology, which facilitates the fabrication of the battery charge sensor as for instance standard epitaxial growth and processing techniques may be used.

The metal may further be selected from a group consisting of Ag, Cu, Al, Mg, Ni, Pd and Pt, or alloys comprising at least one metal selected from the group. These materials are known to provide LSPRs in the ultra violet-visible-near infrared UV-vis-NIR wavelength ranges of the electromagnetic spectrum. Hence standard optical techniques may be used to excite and detect LSPRs of the plasmonic sensing elements, which simplify the detection of changes in the LSPR condition.

The person skilled in the art should understand that other metals providing LSPRs may also be used.

The person skilled in the art further realizes that the electromagnetic properties of the battery charge sensor may be changed by varying, in accordance with the disclosed materials, shapes and/or dimensions of the plasmonic sensing elements given above. Hence the LSPR condition may be tuned such that the specific optical wavelength for which the LSPR occurs is provided at a suitable wavelength range.

To this end the battery charge sensor may comprise a plurality of plasmonic sensing elements of different materials and having different shapes, and/or dimensions. Accordingly, the LSPR of the different plasmonic sensing elements may be different which simplifies the identification and analysis of the different plasmonic sensing elements.

Figure 3:
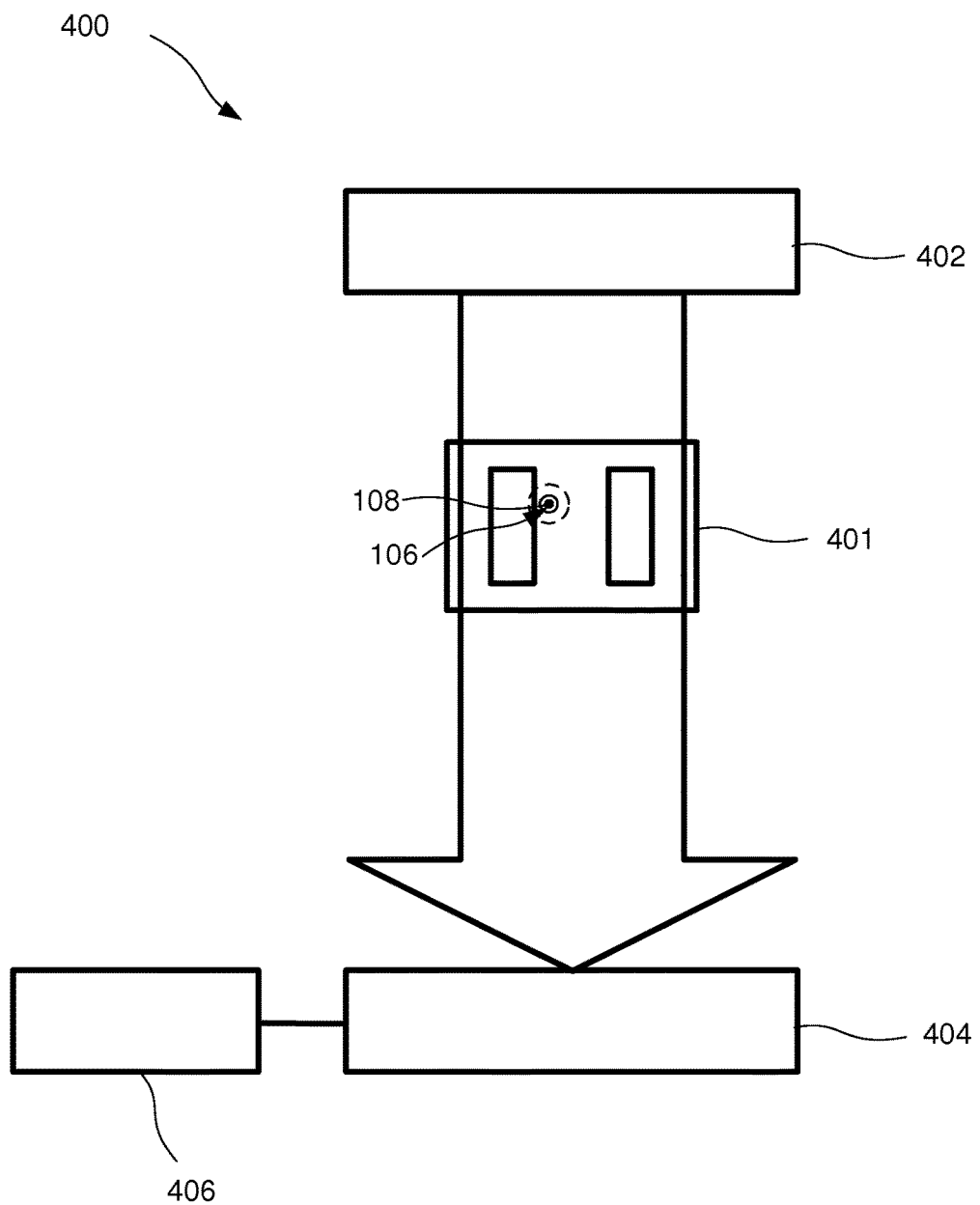
FIG. 3 is a schematic view of a system for determining a charge state of a battery according to one embodiment of the invention.

FIG. 3 illustrates a system 400 for determining a charge state of a battery 100 according to one embodiment of the invention. The system comprising a battery 100, a source 402 of electromagnetic radiation arranged to illuminate the plasmonic sensing element 108 of the battery charge sensor 106 such that the plasmonic sensing element 108 exhibits a localized surface plasmon resonance condition. The system 400 further comprises a detector 404 arranged to detect electromagnetic radiation pertaining to the localized surface plasmon resonance condition of the plasmonic sensing element 108 and a processing unit 406 arranged to analyse the detected electromagnetic radiation to determine the charge state of the battery 100.

The processing unit 406 may accordingly be used to determine the scattered and/or reflected and/or transmitted light pertaining to the LSPR condition of a plasmonic sensing element. The system 400 for determining a charge state of a battery may thereby take advantage of the reliability and robustness of the battery charge sensor, when determining the charge state of a battery 100. An efficient system for monitoring LSPR an/or changes to the LSPR is furthermore provided by detecting electromagnetic radiation that is being scattered and/or reflected by and/or transmitted through the battery charge sensor.

It should be noted that the system for determining a charge state of a battery may be arranged to monitor at least one LSPR of a plasmonic sensing element and/or a plurality of plasmonic sensing element by using spatially and/or spectrally resolved spectroscopic and/or imaging techniques.

The source 402 of electromagnetic radiation for illuminating the battery charge sensor 106 may be a broad band illumination source such as white light comprising electromagnetic radiation in the ultraviolet to infrared wavelength range. Such an illumination source provides efficient excitation and spectroscopic analysis of the LSPRs of the plasmonic sensing element of the battery charge sensor 106. The source 402 of electromagnetic radiation further makes it possible to use conventional optical components such as lenses and mirrors, and allows for simple and less costly instrumentation. As an example standard silicon detectors may be used to detect the LSPRs and changes to the LSPRs.

Using the system 400 for determining a charge state of a battery 100 light that is reflected by and/or transmitted through the battery charge sensor 106 is acquired by the detector 404. An extinction spectrum (not shown) pertaining to the excitation of LSPRs of the plasmonic sensing element 108 is obtained by use of the processing unit 406 and conventional methods to, for instance, normalize light from the source 402 of electromagnetic radiation.

The extinction spectrum has characteristic features resulting from the choice of plasmonic sensing element 108, the materials used in the battery 401, and the charge state of the battery 401. The extinction spectrum may be described by parameters such as the centre wavelength and the peak intensity, and the full width at half maximum of the spectrum. The full width at half maximum is for instance related to the damping of the LSPR of the plasmonic sensing element 108. The parameters may be determined by the processing unit 406 by analysing the extinction spectrum and from theses the charge state of the battery may be determined. The system may according to one embodiment be calibrated using at least one known charge state of the battery.

A person skilled in the art realizes that other type of optical process such as scattering and absorption may instead be monitored in order to detect the LSPR condition such that the charge state of the battery may be determined.

It should be noted that in other embodiments the charge state may be determined from at least one of a spectral position of a resonance frequency, an amplitude of the optical cross-section, and a damping of the LSPR condition or a change to any of these. The source 402 of electromagnetic radiation may also provide monochromatic light, which may be obtained by using a broadband source and optical filters or monochromators, or a narrow band light emitting diode or a laser.

The source 402 of electromagnetic radiation may furthermore, be arranged to illuminate an additional plasmonic sensing element of the battery charge sensor such that the additional plasmonic sensing element exhibits a localized surface plasmon resonance condition.

Figure 4:
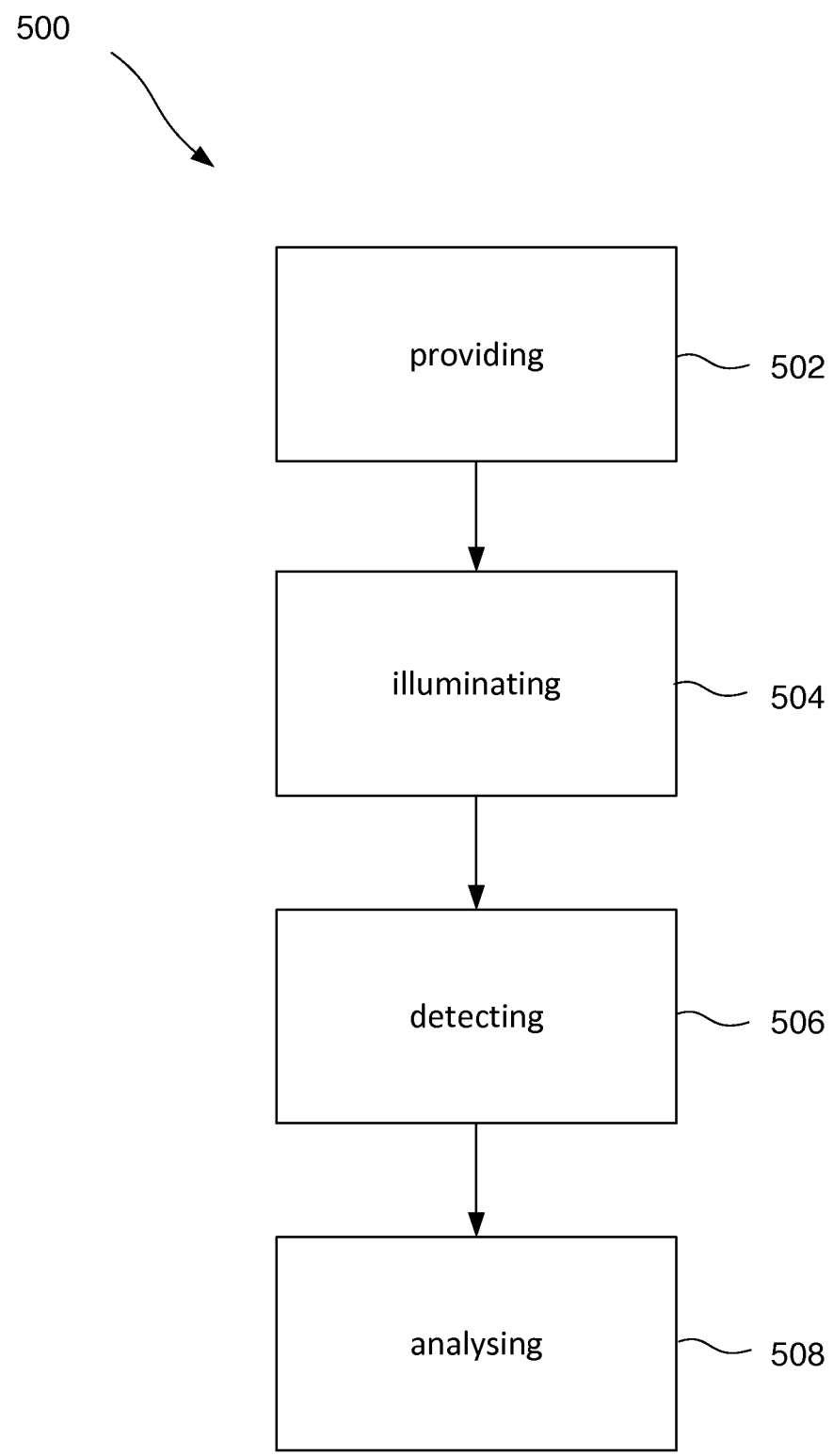
FIG. 4 is a schematic flow chart, showing a method for determining a charge state of a battery according to one embodiment of the invention.

FIG. 4 is a schematic flow chart, showing a method 500 for determining a charge state of a battery according to one embodiment of the invention. The method comprises providing 502 a battery according to any of the embodiments above, illuminating 504 by means of a source of electromagnetic radiation the plasmonic sensing element of the battery charge sensor such that the plasmonic sensing element exhibits a localized surface plasmon resonance condition, detecting 506 by means of a detector the electromagnetic radiation pertaining to the localized surface plasmon resonance condition of the plasmonic sensing element, analysing 508 by means of a processing unit the detected electromagnetic radiation to determine the charge state of the battery.

The method may further comprise the step of illuminating by means of a source of electromagnetic radiation an additional plasmonic sensing element of the battery charge sensor such that the additional plasmonic sensing element exhibits a localized surface plasmon resonance condition and the step of detecting by means of a detector the electromagnetic radiation pertaining to the localized surface plasmon resonance condition of the additional plasmonic sensing element.

In general, features of the method according to the present invention provide similar advantages as discussed above in relation to the battery comprising a battery charge sensor and the system for determining a charge state of a battery described above.

The person skilled in the art realizes that the present invention by no means is limited to the preferred embodiments described above. On the contrary, many modifications and variations are possible within the scope of the applied claims.

Additionally, variations to the disclosed embodiments can be understood and effected by the skilled person practicing the claimed invention, from study of the drawings, the disclosure, and the appended claims. Moreover, in the drawings and specifications, there have been disclosed preferred embodiments and examples of the invention and, although specific term are employed, they are used in a generic and descriptive sense only, and not for the purpose of limitation, the scope of the invention being set forth in the following claims. In the claims, the word "comprising" does not exclude other elements or steps, and the indefinite article "a" or "an" does not exclude a plurality.

The invention claimed is:

1. A battery comprising:
   an electrode material;
   an electrolyte material; and
   a battery charge sensor comprising a plasmonic sensing element having a sensing volume within the battery, wherein the plasmonic sensing element is configured to exhibit a localized surface plasmon resonance condition dependent on a charge state of the battery, when the plasmonic sensing element is illuminated with electromagnetic radiation.

2. The battery according to claim 1, wherein the plasmonic sensing element is arranged at a predetermined depth within the electrode material and wherein the sensing volume of the plasmonic sensing element covers a portion of the electrode material.

3. The battery according to claim 1, wherein the plasmonic sensing element is arranged within the electrolyte material and wherein the sensing volume of the plasmonic sensing element covers a portion of the electrolyte material.

4. The battery according to claim 1, wherein the battery charge sensor further comprises a separating layer which is arranged at an outer surface of the plasmonic sensing element.

5. The battery according to claim 4, wherein the separating layer of the battery charge sensor is arranged such that the sensing volume of the plasmonic sensing element covers a portion of the electrode material and/or the electrolyte material.

6. The battery according to claim 4, wherein the separating layer comprises a material selected from at least one of a metal oxide, a metal carbide, a metal nitride, a semiconductor oxide, a semiconductor nitride, a semiconductor carbide, an insulator, or a polymer.

7. The battery according to claim 4, wherein the separating layer has a thickness in the range of 0.5 to 150 nm.

8. The battery according to claim 1, further comprising an additional plasmonic sensing element which is arranged within a shielding layer, and wherein the sensing volume of the additional plasmonic sensing element is within the shielding layer of the additional plasmonic sensing element.

9. The battery according to claim 1, wherein the plasmonic sensing element is a disk, rod, wire, ellipse, polygon, triangle, sphere, cube, star, hole in thin metal film, nanoshell, core-shell particle, nanorice or nanoring.

10. The battery according to claim 1, wherein the plasmonic sensing element comprises a semiconductor and/or a metal.

11. The battery according to claim 10, wherein the metal is selected from a group consisting of Ag, Au, Cu, Al, Mg, Ni, Pd and Pt, or alloys comprising at least one metal selected from the group.

12. A system for determining a charge state of a battery comprising:
the battery according to claim 1;
a source of electromagnetic radiation arranged to illuminate the plasmonic sensing element of the battery charge sensor such that the plasmonic sensing element exhibits a localized surface plasmon resonance condition;
a detector arranged to detect electromagnetic radiation pertaining to the localized surface plasmon resonance condition of the plasmonic sensing element; and
a processing unit arranged to analyse said detected electromagnetic radiation to determine the charge state of the battery.

13. A method for determining a charge state of a battery, the method comprising:
providing the battery as claimed in claim 1,
illuminating by means of a source of electromagnetic radiation the plasmonic sensing element of the battery charge sensor such that the plasmonic sensing element exhibits a localized surface plasmon resonance condition;
detecting by means of a detector the electromagnetic radiation pertaining to the localized surface plasmon resonance condition of the plasmonic sensing element; and
analysing by means of a processing unit the detected electromagnetic radiation to determine the charge state of the battery.

* * * * *